United States Patent
Tseng

[19]

[11] Patent Number: 5,861,343
[45] Date of Patent: *Jan. 19, 1999

[54] METHOD FOR FABRICATING AN ALIGNED OPENING USING A PHOTORESIST POLYMER AS A SIDE WALL SPACER

[75] Inventor: Horng-Huei Tseng, Hsinchu, Taiwan

[73] Assignee: Vanguard International Semiconductor Corporation, Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 693,957

[22] Filed: Aug. 7, 1996

[51] Int. Cl.$^6$ .................................................. H01L 21/465
[52] U.S. Cl. .......................... 438/666; 438/637; 438/696; 438/947; 438/700
[58] Field of Search .................................... 437/186, 191, 437/203, 228, 229; 156/659.11; 438/666, 637, 696, 700, 947, 713, 725

[56] References Cited

U.S. PATENT DOCUMENTS

| | | | |
|---|---|---|---|
| 5,525,552 | 6/1996 | Huang | 437/41 |
| 5,563,098 | 10/1996 | Kuo et al. | 437/191 |
| 5,719,089 | 2/1998 | Cherng et al. | 438/637 |

OTHER PUBLICATIONS

Sorab K. Ghandki, VLSI Fabrication Principles, Wiley & Sons (1983) p. 544.

*Primary Examiner*—Caridad Everhart
*Attorney, Agent, or Firm*—Christensen O'Connor Johnson & Kindness PLLC

[57] ABSTRACT

The present invention relates to a method of forming a self-contact hole on a semiconductor substrate. A polysilicon layer is formed over a substrate. A photoresist is patterned on the polysilicon layer. Then an etching is performed to etch the polysilicon layer, and during the etch polymers are formed on the side wall the polysilicon layer and the photoresist. Using the polymer side wall spacer as a mask to formed an opening in the polysilicon layer. Subsequently, the photoresist and side wall spacer are removed. A opening which is smaller than the conventional one is formed, that will increase the accuracy of a contact hole alignment.

12 Claims, 3 Drawing Sheets the prior art.

METHOD FOR FABRICATING AN ALIGNED OPENING USING A PHOTORESIST POLYMER AS A SIDE WALL SPACER

FIELD OF THE INVENTION

The present invention relates to a method of fabricating a semiconductor device, and more specifically, to a method of forming an aligned opening in the semiconductor device.

BACKGROUND OF THE INVENTION

It has been the trend in integrated circuit technology to increase the density of semiconductor devices per unit area of silicon wafer. It follows then that the semiconductor devices, such as transistors and capacitors, must be made smaller and smaller. However, one area which poses as a significant barrier to the miniaturization of semiconductor devices is photolithography. In particular, the problem of "registration" accuracy arises. Registration refers to the aligning of a mask to the semiconductor wafer to ensure that the mask is correctly positioned atop the features of the wafer. For a further discussion of registration, the reader is invited to review *Silicon Processing for the VLSI Era*, Vol. 1—*Process Technology*, S. Wolf and R. N. Tauber, Lattice Press, 1986, pp. 473–476.

The registration problem arises when, for example, semiconductor MOSFET transistors become very small. For discussion, assume the dimension of the channel underneath the gate of the transistor is smaller than 0.5 micron. In certain types of transistors, such as floating gate transistors, it is important to align an opening precisely atop the gate. This is required, in this case, to separate the contacts between the source and the drain of the transistor.

The masking of the photoresist needs to be extremely accurate in order for a contact opening to be aligned precisely atop of the gate. If the photoresist is not correctly aligned with the gate, then a trench is formed in the substrate and in the field oxide edge which results in probable failure, or degradation in the performance, of the transistor during operation. Currently, the registration tolerance of modern photolithography is on the order of 0.05–0.2 microns. Therefore, if the gate is in the sub 0.5 micron range, the mask may not align precisely over the gate due to registration errors.

To illustrate the effect of misalignment as discussed above, FIG. 1 shows a transistor formed from a misaligned opening. A MOS transistor and field oxide region 4 are formed on a semiconductor substrate 2. The MOS transistor comprises a gate oxide 6, a polysilicon gate 8, a capped oxide 10 and side wall spacers 12. Source and drain regions (not shown) are formed in the substrate 2 and border both sides of the gate 8.

A polysilicon layer 14 is then deposited on the substrate 2, the MOS transistor and on the field oxide region 4. As is known in the art, the polysilicon layer 14 is typically used to form electrical connections to the source and drain of the transistor. Next, a photoresist 16 is deposited on the polysilicon layer 14. A mask is then typically used to soften the photoresist 16 in predetermined locales for etching. Finally, an etching process is performed to form openings 18. However, because of the misalignment of the mask, during the etching process, trenches 20 are generated on the substrate 2. Oftentimes, the misalignment will lead to failure of the transistor.

The present invention solves these and other problems of the prior art.

SUMMARY OF THE INVENTION

A method of forming an aligned opening over a gate of a MOS transistor is disclosed. The method comprises the steps of forming a contact polysilicon layer on said MOS transistor, forming a photoresist layer on said contact polysilicon layer, removing portions of said photoresist layer to form an opening through said photoresist layer, said opening generally aligned above said gate, etching through said opening said contact polysilicon layer such that during said etching forming polymer sidewalls on the inner surface of said opening, and etching said contact polysilicon layer to the surface of said gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In the present invention, a new method is disclosed to form aligned openings. The formation of the aligned openings includes many process steps that are well known in the art. For example, the process of photolithography masking and etching is used extensively herein. This process consists of creating a photolithography mask containing the pattern of the component to be formed, coating the wafer with a light sensitive material known as a photoresist, exposing the photoresist coated wafer to ultra-violet light through the mask to soften or harden parts of the photoresist (depending on whether positive or negative photoresist is used), removing the softened parts of the photoresist, etching to remove the materials left unprotected by the photoresist and stripping the remaining photoresist. This photolithography masking and etching process are referred to as "patterning and etching." Additionally, it should be pointed out that the method described herein includes many conventional process steps that are well known in the art. Each of these steps are conventional and will not be described in detail herein.

Figure 1:
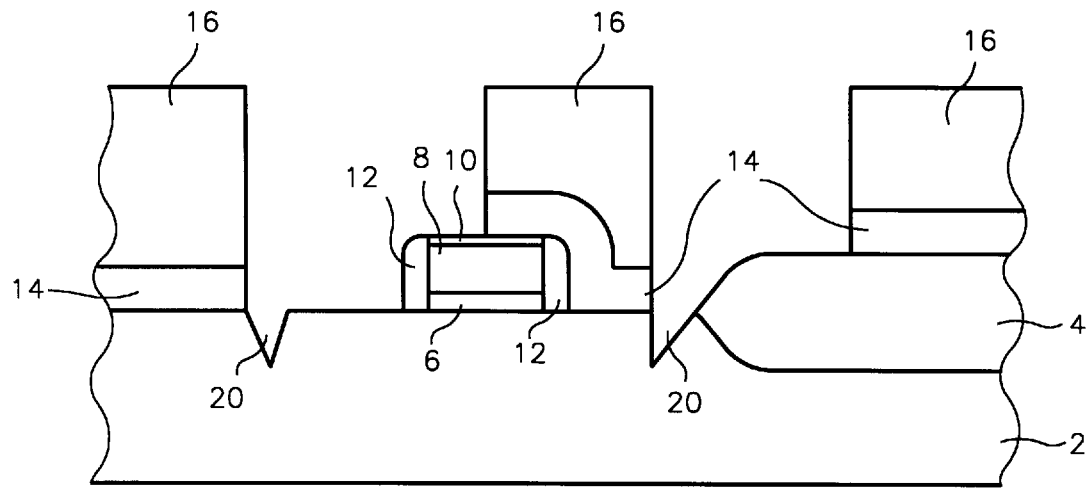
FIG. 1 is a cross section view of a MOS transistor having misaligned openings.
Figure 2:
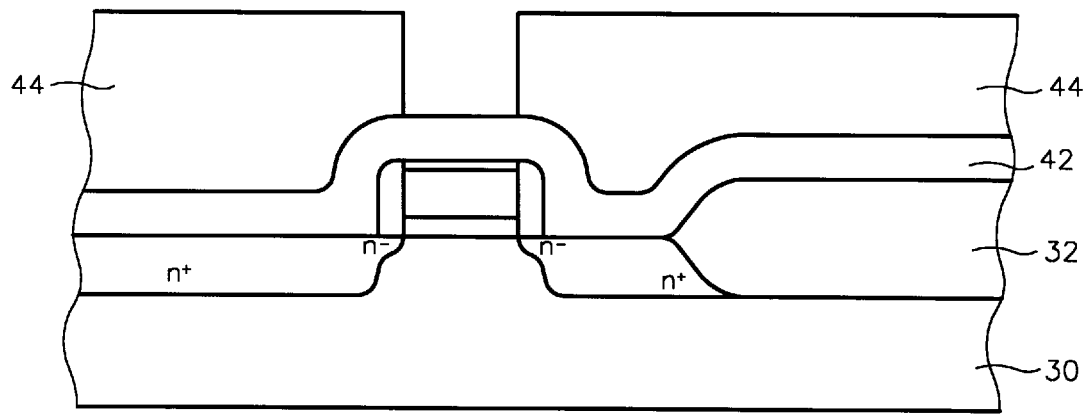
FIG. 2 is a cross section view of a semiconductor wafer illustrating an intermediate step of forming an opening in accordance with the present invention.

Turning to FIG. 2, a single crystal substrate 30 is used. Preferably, the single crystal substrate 30 is P-type with a <100> crystallographic orientation. A thick field oxide region (FOX) 32 is created for purposes of isolation. Generally speaking, the FOX 32 region is created via photolithography and dry etching steps to etch a silicon nitride-silicon dioxide composite layer. After the photoresist is removed and wet cleaned, a thermal oxidation in an oxygen-steam ambient is used to form the FOX 32 region, to a thickness of about 3000–6000 angstroms.

Initially, a first silicon dioxide layer 34 is created atop the substrate 30 to act as the gate oxide. In the preferred embodiment, the first silicon dioxide layer 34 is formed by using an oxygen-steam ambient, at a temperature between about 850° to 1000° C. Alternatively, the gate oxide may be formed using other known oxide chemical compositions and procedures. As is known in the art, by controlling the pressure and time at which the oxygen-steam ambient is exposed to the substrate, the thickness of the silicon dioxide layer 34 can be easily controlled. In the preferred embodiment, the thickness of the first silicon dioxide layer 34 is approximately 50–200 angstroms.

Still referring to FIG. 2, after the first silicon dioxide layer 34 is formed, a first polysilicon layer 36 is formed over the first silicon dioxide layer 34 and the field oxide regions 32. In the preferred embodiment, the first polysilicon layer 36 is formed by using conventional chemical vapor deposition (CVD) to have a thickness about 2000–4000 angstroms.

Next, a capped oxide layer 38 is formed atop the first polysilicon layer 36 for the purpose of electrically isolating the first polysilicon layer 36. Thus, in this example, the MOS transistor being formed is a floating-gate transistor. The thickness of the capped layer is about 1000–1500 angstroms. Subsequently, side wall spacers 40 are formed by depositing a second silicon dioxide layer on the substrate, then an anistropic etching is performed to etchback the second silicon dioxide. Similarly, the second silicon dioxide layer can be formed by using TEOS or any other well known process. Of course, the lightly doped drain structure is formed prior to the side wall spacers via ion implantation. Finally, ion implantation is performed again to form the impurity regions i.e. the source and the drain. The formation of the floating gate transistor described above is well known in the art.

Still referring to FIG. 2, a second polysilicon layer 42 is formed atop the MOS transistor and the field oxide region 32. The thickness of the second polysilicon layer 42 is preferably approximately 2000–4000 angstroms. In the preferred embodiment, the second polysilicon layer 42 is formed by using conventional chemical vapor deposition (CVD). Portions of the second polysilicon layer will be used as electrical connections for the source and drain of the MOS transistor. The second polysilicon layer is also referred to as the contact polysilicon layer.

Next, a photoresist 44 is deposited onto the second polysilicon layer 42 to have a thickness about 6000–12000 angstroms. Using masking, an opening 48 is formed in the photoresist 44. Optimally, the masking is aligned with the gate of the MOS transistor (the gate is also referred to as a "feature" that an opening is intended to cover). As will be seen in greater detail below, even if the opening 48 is not currently aligned with the gate exactly, the further process steps will ensure that the opening 48 will be aligned.

Figure 3:
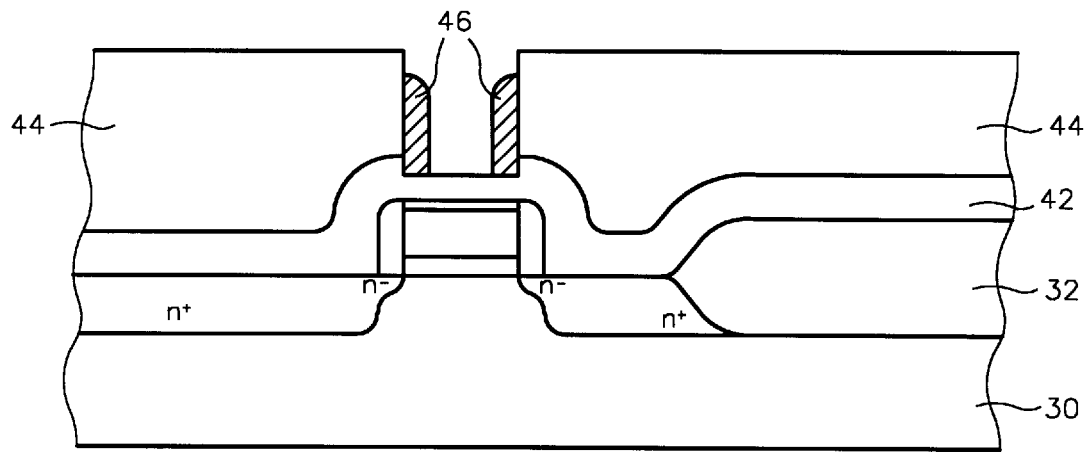
FIG. 3 is a cross section view of a semiconductor wafer illustrating the step of etching the polysilicon layer and forming sidewall spacers in accordance with the present invention.

Turning to FIG. 3, a dry etching is performed to etch a portion of the second polysilicon layer 42. In the preferred embodiment, a reactive ion etching (RIE) process is used. Alternatively, an electron cyclotron resonance (ECR) process or other plasma etching processes can also be used. During the etching process, the photoresist 44 and the second polysilicon layer 42 are etched by the etching process. In the preferred embodiment, the etching is performed with a $Cl_2$, HBr, $SF_6$, $C_2F_6$, $CHF_3$, or $CF_4$ reaction gas.

During the etching process, polymer sidewall spacers 46 are created on the sidewall of the polysilicon layer 42 and photoresist 44. Specifically, it has been found that the combination of the etching gas, the photoresist 44, and the polysilicon react to form polymer sidewall spacers 46. Typically, the polymers are composed of $Si_wC_xH_yO_z$. The opening 48 is now narrowed in view of the polymer spacers 46.

Figure 4:
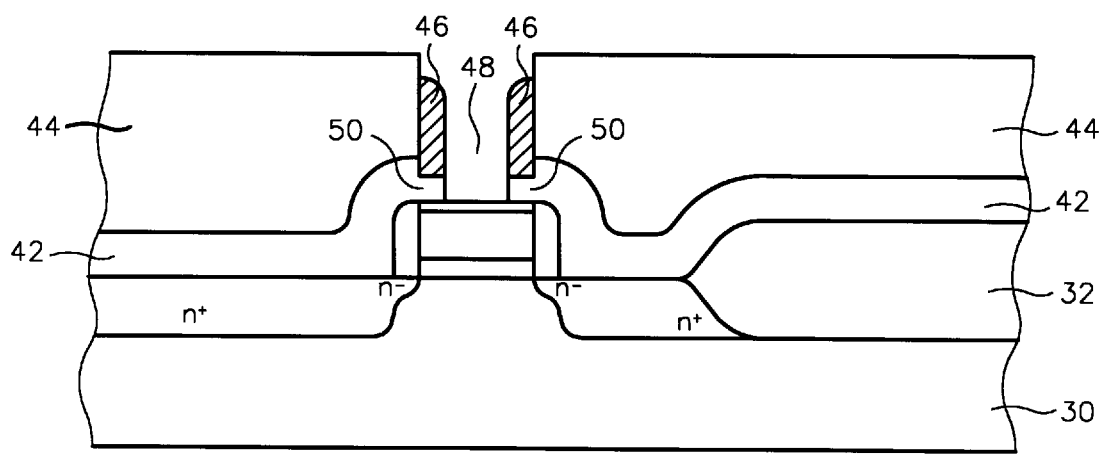
FIG. 4 is a cross section view of a semiconductor wafer illustrating the step of forming polysilicon ladders in accordance with the present invention.

Turning to FIG. 4, further dry etching is performed to etch the second polysilicon layer 42 which is not covered by polymer sidewalls 46 and photoresist 44. The dry etching should be done until the surface of the capped oxide layer 38 is reached. Alternatively, a reactive ion etching (RIE), an electron cyclotron resonance (ECR) process or other similar process may be used. Similarly, the reaction gas may be selected from $Cl_2$, HBr, $SF_6$, $C_2F_6$, $CHF_3$ or $CF_4$.

Figure 5:
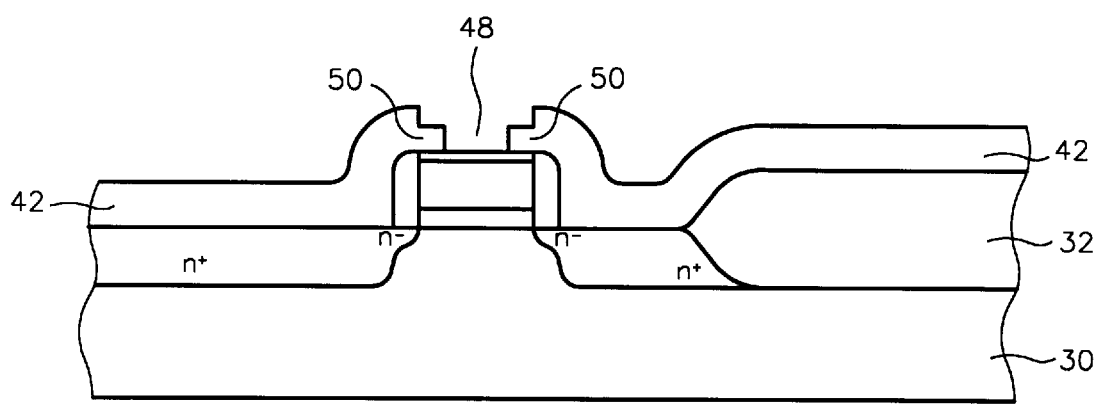
FIG. 5 is a cross section view of a semiconductor wafer illustrating the step of removing the polysilicon layer and the photoresist in accordance with the present invention.

Finally, as shown in FIG. 5, the photoresist 44 and the polymer sidewalls 46 are removed by $H_2SO_4$ solution and oxygen plasma. Polysilicon ladders 50 are formed by the present invention. As can be seen, the polysilicon ladders 50 are wider in the top portion and narrower in the bottom portion.

To further explain, assume that the gate size is 0.5 microns. Assume further that the registration tolerance of the photolithography process is 0.2 microns. Finally, assume a worst case scenario where the opening 48 of the third polysilicon layer 46 formed by photolithography is 0.2 microns shifted off of the gate. Left uncorrected, the etching step would result in a trench being formed in either the source or drain of the MOS transistor. However, by adding the sidewalls 46, the opening 48 is narrowed by, for example, 0.4 microns (0.2 microns on both sides of opening 48). The opening 48 is now 0.1 microns in width with none of the opening 48 over the source or the drain. Although the opening 48 is considerably smaller, i.e. 0.1 microns, in some applications such as a floating gate MOS transistor, this opening is adequate to isolate the source from the drain.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming an aligned opening over a gate of a MOS transistor, said method comprising the steps of:

forming a contact polysilicon layer on said MOS transistor;

forming a photoresist layer on said contact polysilicon layer;

removing portions of said photoresist layer to form an opening through said photoresist layer, said opening generally aligned above said gate;

etching through said opening said contact polysilicon layer such that during said etching forming polymer sidewalls on the inner surface of said opening;

etching said contact polysilicon layer to the surface of said gate for forming polysilicon ladders by using said photoresist and said polymer sidewalls as an etching mask therefore narrowing said opening to increase the tolerance of misalignment, wherein said polysilicon ladders are wider in the top portion and narrower in the bottom portion; and removing said photoresist and said polymer sidewalls.

2. The method of claim 1 further including the step of removing said photoresist and said polymer sidewalls.

3. The method of claim 1 wherein said contact polysilicon layer is formed to have a thickness of a range about 2000–4000 angstroms.

4. The method of claim 1 wherein said photoresist is formed to have a thickness of approximately 6000–12000 angstroms.

5. The method of claim 1 wherein said etching is performed by dry etching.

6. The method of claim 5, wherein said dry etching is reactive ion etching.

7. The method of claim 1, wherein the reaction gas of said etching to etch said contact polysilicon layer is selected from $Cl_2$, $HBr$, $SF_6$, $C_2F_6$, $CHF_3$ or $CF_4$.

8. The method of claim 2, wherein said photoresist and said polymers are removed by $H_2SO_4$ solution and oxygen plasma.

9. A method of forming an aligned opening over a gate of a MOS transistor on a semiconductor substrate, said method comprising the steps of:

forming a polysilicon layer over at least said gate of said MOS transistor;

forming a photoresist on said polysilicon layer, said photoresist having an opening generally aligned with said gate;

etching said polysilicon layer through said opening by reactive ion etching such that during said etching, polymer sidewalls are created on the inner surface of said opening;

etching said polysilicon layer to the surface of said gate for forming polysilicon ladders by using said photoresist and said polymer sidewalls as an etching mask therefore narrowing said opening to increase the tolerance of misalignment, wherein said polysilicon ladders are wider in the top portion and narrower in the bottom portion, the reaction gas of said etching selected from $Cl_2$, $HBr$, $SF_6$, $C_2F_6$, $CHF_3$ or $CF_4$; and removing said photoresist and said polymer sidewalls.

10. The method of claim 9 wherein said polysilicon layer is formed to have a thickness of a range about 2000–4000 angstroms.

11. The method of claim 9 wherein said photoresist is formed to have a thickness of approximately 6000–12000 angstroms.

12. The method of claim 9 wherein said photoresist and said polymers are removed by $H_2SO_4$ solution and oxygen plasma.

* * * * *